Oct. 18, 1955 L. T. RHODES ET AL 2,721,268
LOCKED-IN OSCILLATOR
Filed Sept. 26, 1946
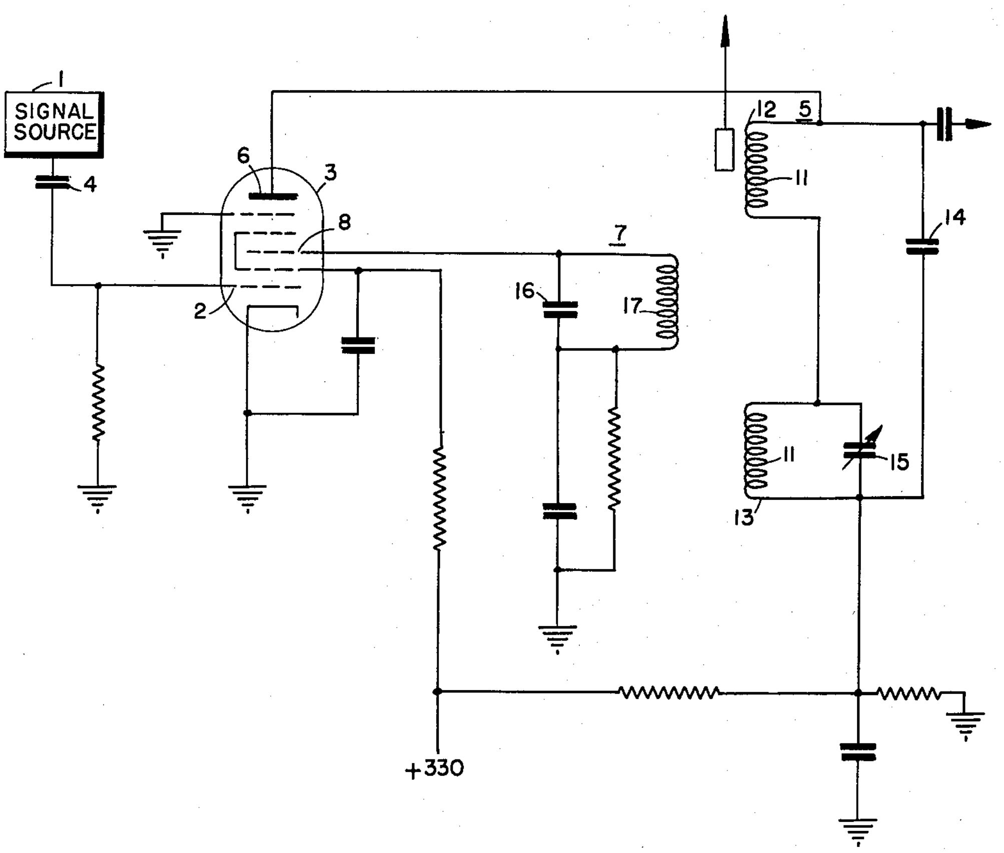
Inventors
LADDIE T. RHODES
KENNETH R. BRUNN
By M. C. Hayes
Attorney

United States Patent Office 2,721,268
Patented Oct. 18, 1955

2,721,268

LOCKED-IN OSCILLATOR

Laddie T. Rhodes and Kenneth R. Brunn, United States Navy

Application September 26, 1946, Serial No. 699,360

3 Claims. (Cl. 250—36)

(Granted under Title 35, U. S. Code (1952), sec. 266)

This invention relates to locked-in oscillators and is particularly directed to an oscillator with high sensitivity to an injected synchronizing signal.

A locked-in oscillator is designed to lock in at an exact multiple or submultiple of an impressed frequency. By the lock-in range of an oscillator is meant either the range of frequency variation of impressed signal over which the oscillator will lock in for constant voltages and circuit parameters or the amount a given circuit voltage or parameter can change and still allow the oscillator to lock in with a given impressed frequency.

One application of a locked-in oscillator in which an increased lock-in range of the latter type is valuable is in the construction of standard oscillators. It may be desired, for example, to build a 200 kc. oscillator in with a 1 mc. crystal controlled oscillator. It is necessary that the 200 kc. oscillator lock in with the impressed 1 mc. frequency regardless of changes in circuit parameters due to moisture or temperature variations or other factors, or of changes in plate and screen voltages supplied to the oscillator tube.

It is therefore an object of the invention to provide an oscillator that will lock in at a submultiple of the impressed frequency over an increased range of frequency.

It is another object of the invention to provide an oscillator that will lock in with a given impressed frequency over wider ranges of oscillator plate or screen voltages or circuit parameter changes.

It is another object of the invention to provide a lock-in oscillator with a multiple resonant plate tank circuit.

The invention will be further described with reference to the drawing which shows in circuit diagram an exemplary embodiment thereof.

The oscillator is designed to lock in at a predetermined submultiple of the frequencies from source 1. For example, if this wave is 4500 kc. modulated with ±75 kc., the oscillator output would be 900 ±15 kc. for a 5 to 1 count down ratio. If a constant frequency of 4500 kc. is impressed, the oscillator output would be a constant frequency of 900 kc. Frequency modulated waves from source 1 are impressed on grid 2 of oscillator tube 3 through coupling condenser 4. A multiple resonant tank circuit 5 is connected to plate 6. In this case circuit 5 is tuned to resonate at one-fifth of the average frequency of the frequency modulated wave from source 1. Oscillations are sustained by feed back through parallel resonant circuit 7 which is tuned to a frequency higher than the fundamental resonant frequency of circuit 5. It is ordinarily tuned to twice this frequency. Circuit 7 is connected to grid 8 of tube 3.

It was found that the lock-in range of the oscillator could be increased by splitting the tank coil inductance and placing it for closer coupling to the grid winding. Also by using a multiple resonant tank circuit more harmonics were fed back to the oscillator with greater lock-in range.

The multiple resonant tank circuit 5 comprises an inductance 11 split into two sections 12 and 13, and condensers 14 and 15. Condenser 14 is connected in parallel with the complete inductance 11, and condenser 15 is connected in parallel with section 13 only of inductance 11. The feed back circuit 7 comprises the capacitance 16 and inductance 17. When no signal is being applied to grid 2 of tube 3, the circuit performs as a normal oscillator. When the impressed frequency changes, the oscillator is thought to lock in at a submultiple of the impressed frequency at grid 2 due to feed back of harmonics $2f$, $3f$, $4f$ etc. to the grid 8. These harmonics are produced because of the distorted output due to grid voltage swings into the curved portions of the Eg-Ip characteristic.

If a signal voltage of $5f$ is applied to grid 2, combination voltages of frequencies $\pm 5af \pm bf$ will be produced, where $a$, $b$=1, 2, 3, etc. For instance, when $b$=1 and $a$=4 or 6, the beat frequency will be $f$. All other frequencies except the beat frequency $f$ will be by-passed since circuit 5 is tuned to the frequency $f$. This injected component caused by the harmonics of the oscillator beating with the signal applied to grid 2 is in phase with the fundamental frequency wave of the oscillating plate circuit. In this condition the circuit becomes stable, and the injected current locks in the incoming signal $f$ in the plate circuit.

Suppose the input frequency $5f$ increases slightly. The beat note of frequency $f$ produced by the oscillator fourth harmonic, for example, will increase by a like amount. A vector representing the amplitude and phase of the beat note will rotate slightly faster than a vector representing the oscillator fundamental. The result is to inject an effective impedance in the tank circuit which swings its frequency back and forth. A point will hence be reached where the frequency of the tank circuit will be exactly one-fifth the input signal, at which stable point the oscillator will lock in. The oscillator will thus follow the frequency modulation of the input signal. Other harmonics of the oscillator which give a frequency $f$ when beating with the impressed input will add their effects in a like manner.

The invention increases the range of frequencies over which the oscillator will lock in by splitting the coil 11 and arranging it for closer coupling to the feed back circuit 7.

Moreover circuit 5 is a multiple resonant circuit having resonant peaks at harmonics above $f$. This results in more harmonics being fed to grid 8 further increasing the lock in range.

Other types of multiple resonance than the arrangement shown in circuit 5 may be employed.

The oscillator will lock in with impressed signals of other types than those discussed herein.

In frequency modulation receivers, better adjacent channel selectivity can be obtained by use of an oscillator designed to lock in at a submultiple of the frequency modulated I.-F. signal. The oscillator of the present invention is particularly adapted to such a use. By using the multiple resonant circuit instead of a simple resonant one, the deviation frequency may be greatly increased or the component parts may be of greater tolerance. With a simple resonant circuit with impressed frequency of 1 mc. and oscillator frequency 200 kc., 2% frequency change was possible before breakout. With a multiple resonant circuit at the same frequency, 4.2% frequency change was possible.

It is to be understood that the embodiment of the invention described above is exemplary only and that the scope of the invention is to be limited only as set forth in the appended claims.

The invention described herein may be manufactured and used by or for the Government of the United States of America for governmental purposes without the payment of any royalties thereon or therefor.

What is claimed is:

1. A locked-in oscillator circuit comprising a vacuum tube having a cathode, a plate, and a multiplicity of grids; means applying frequency modulated signal waves to one of said grids; a multiple resonant tank circuit connected to the plate and comprising a split inductance, a condenser in parallel with the split inductance, and another condenser in parallel with one section of the split inductance; and a parallel resonant inductance and capacity resonating at a frequency higher than the fundamental resonance frequency of the tank circuit, said parallel resonant circuit being inductively coupled to the split inductance of the tank circuit and connected to a grid of the vacuum tube other than the one to which the frequency modulated signal waves are applied.

2. A locked-in oscillator circuit comprising, an electron discharge device having an anode, a cathode and at least first and second control electrodes, means for applying a signal, frequency modulated around a center frequency, to said first control electrode, a first tank circuit connected to said anode and comprising a two section spatially split inductance, a condenser in parallel with the whole of said inductance and another condenser in parallel with a section of the same, said first tank circuit having a primary resonance mode which is a sub-multiple of said center frequency and other resonance modes harmonically related to said primary mode, and a second tank circuit coupled to said second control electrode and disposed to be coupled by a close inductive oscillatory feedback coupling to both sections of said split inductance, said second tank circuit having a resonance mode at twice the frequency of said first tank circuit primary mode.

3. A locked-in oscillator circuit comprising, an electron discharge device having an anode, a cathode and at least first and second control electrodes, means for applying a signal, frequency modulated around a center frequency, to said first control electrode, a first tank circuit connected to said anode and comprising a two section spatially split inductance, a condenser in parallel with the whole of said inductance and another condenser in parallel with a section of the same, said first tank circuit having a primary resonance mode which is a sub-multiple of said center frequency and other resonance modes harmonically related to said primary mode, and a second tank circuit coupled to said second control electrode and disposed interjacent the sections of said split inductance thereby closely coupling by inductive means said first and second tanks, said second tank circuit having a resonance mode at twice the frequency of said first tank circuit primary mode.

References Cited in the file of this patent

UNITED STATES PATENTS

| | | |
|---|---|---|
| 1,559,869 | Hartley | Nov. 3, 1925 |
| 1,962,392 | Harmon | June 12, 1934 |
| 2,000,362 | Terman | May 7, 1935 |
| 2,098,386 | Hansell | Nov. 9, 1937 |
| 2,186,434 | Senauke | June 9, 1940 |
| 2,230,557 | Babik | Feb. 4, 1941 |
| 2,356,201 | Beers | Aug. 22, 1944 |
| 2,411,003 | Sands | Nov. 12, 1946 |
| 2,488,585 | Corrington | Nov. 22, 1949 |
| 2,513,763 | Vilkemerson | July 4, 1950 |